United States Patent
Kim et al.

(10) Patent No.: US 6,800,907 B2
(45) Date of Patent: Oct. 5, 2004

(54) METHOD FOR FABRICATING SEMICONDUCTOR DEVICE

(75) Inventors: Jae-Ok Kim, Ichon-shi (KR); Woo-Jin Kim, Ichon-shi (KR); Jong-Hyuk Oh, Ichon-shi (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 33 days.

(21) Appl. No.: 10/330,341

(22) Filed: Dec. 30, 2002

(65) Prior Publication Data

US 2003/0216021 A1 Nov. 20, 2003

(30) Foreign Application Priority Data

May 16, 2002 (KR) ........................................ 2002-27117

(51) Int. Cl.[7] ...................... H01L 23/62; H01L 21/4763
(52) U.S. Cl. ...................... 257/356; 257/360; 257/361; 257/412; 257/774; 438/618
(58) Field of Search ................................. 438/301, 592, 438/300, 353, 595

(56) References Cited

U.S. PATENT DOCUMENTS

| 5,760,445 A | * | 6/1998 | Diaz ........................... 257/356 |
| 5,793,114 A | * | 8/1998 | Nguyen et al. ............. 257/774 |
| 5,807,779 A | | 9/1998 | Liaw |
| 5,827,764 A | | 10/1998 | Liaw et al. |
| 5,972,759 A | | 10/1999 | Liaw |
| 5,972,765 A | * | 10/1999 | Clark et al. .................. 438/308 |
| 6,015,740 A | * | 1/2000 | Milic-Strkalj ............... 438/300 |
| 6,077,733 A | | 6/2000 | Chen et al. |
| 6,100,138 A | | 8/2000 | Tu |
| 6,117,760 A | * | 9/2000 | Gardner et al. ............. 438/618 |
| 6,121,684 A | | 9/2000 | Liaw |
| 6,180,501 B1 | | 1/2001 | Pey et al. |
| 6,239,458 B1 | | 5/2001 | Liaw et al. |
| 6,255,177 B1 | | 7/2001 | Fang et al. |
| 6,265,295 B1 | | 7/2001 | Lin et al. |
| 6,284,605 B1 | | 9/2001 | Kim et al. |
| 6,309,929 B1 | | 10/2001 | Hsu et al. |
| 6,521,963 B1 | * | 2/2003 | Ota et al. .................... 257/412 |

FOREIGN PATENT DOCUMENTS

JP 3-133130 A 6/1991

* cited by examiner

*Primary Examiner*—John F. Niebling
*Assistant Examiner*—Ron Pompey
(74) *Attorney, Agent, or Firm*—Birch, Stewart, Kolasch & Birch, LLP

(57) ABSTRACT

The present invention provides a method for fabricating a semiconductor device capable of suppressing stresses concentrated at bottom corners of a gate electrode as simultaneously as preventing an oxidation of a metal included in a gate electrode. The inventive method includes the steps of: forming a gate oxide layer on a substrate; forming a gate electrode including at least one metal layer on the gate oxide layer; forming an oxide layer on the substrate including the gate electrode at a temperature lower than oxidation temperature of the metal layer; and etching selectively the densified oxide layer so as to form an oxide spacer on the lateral sides of the gate electrode.

15 Claims, 6 Drawing Sheets

METHOD FOR FABRICATING SEMICONDUCTOR DEVICE

FIELD OF THE INVENTION

The present invention relates to a method for fabricating a semiconductor device; and, more particularly, a method for fabricating a semiconductor device improved on a confidence level in a hot carrier and a refresh characteristic.

DESCRIPTION OF RELATED ARTS

In general, a gate electrode is an electrode for selecting a metal oxide semiconductor (MOS) transistor and formed with a polysilicon layer doped mainly with impurities. Particularly, the gate electrode has a stacked structure of either a polysilicon layer doped with impurities and a tungsten silicide $WSi_2$ layer or a doped polysilicon and a titanium silicide $TiSi_2$ layer in order to reduce resistivity of the gate electrode.

However, in case of forming the gate electrode in the stacked structure of the doped polysilicon and the metal silicide layer, there is a problem for a highly integrated semiconductor device to obtain a lower resistance of the micro-gate electrode although the above-stacked structure is usefully applicable for a lowly integrated semiconductor device.

In other words, the tungsten silicide layer has the resistivity with a value of approximately $100\mu\Omega$-cm. In a dynamic random access memory (hereinafter referred as to DRAM) device of which capacitance is in about 1 giga bites, resistance of the gate electrode should be decreased in more extents in order to develop a device operating with a high speed in a micro-line width.

Therefore, in case of a next generation semiconductor device to which a technology of a micro-circuit line width less than 0.13 $\mu$m is applied, the resistivity is approximately $10\mu\Omega$-cm, and a single metal such as tungsten W, titanium Ti or molybdenum Mo is stacked on top of the polysilicon layer as to be used as a gate electrode. The reason for using the single metal for the polysilicon layer is because it has a higher conductivity than the tungsten silicide layer or titanium silicide layer.

FIGS. 1A and 1B are cross-sectional views illustrating a method for fabricating a semiconductor device in accordance with a prior art.

With reference to FIG. 1A, a gate oxide layer 12 is formed on a substrate 11, and then, a polysilicon layer 13, a tungsten layer 14 and a hard mask 15 are sequentially deposited thereon.

Subsequently, a mask (not shown) for forming a gate electrode is formed on the hard mask 15, which is, in turn, etched through the use of the mask. After the etching, the mask is removed. Then, the etched hard mask 15 etches the tungsten layer 14 and the polysilicon layer 13 so as to a gate electrode stacked in an order of the polysilicon layer 13 and the tungsten layer 14.

Next, in the etching process for forming the gate electrode, damages provoked at a surface of the gate electrode 12 and remnants from the etching process are removed. In order to recover a confidence level of the gate oxide layer 12, an oxide layer 13A is formed on lateral sides of the polysilicon layer 13 through a re-oxidation process that re-oxidate selectively the polysilicon layer 13.

Herein, proceeding of the re-oxidation process can prevent electric fields from concentrating at corners of the gate electrode.

Afterwards, a lowly concentrated impurity area 16 is formed on the substrate 11 through an ion implantation by using the gate electrode as a mask. In case of a typical n-metal oxide semiconductor field effect transistor (nMOSFET), the lowly concentrated impurity area 16 is called as a lightly doped drain (LDD) area. Then, an insulting layer 17 to be used for a spacer 18 (hereinafter referred as to spacer insulating layer) is deposited on an entire surface including the gate electrode.

As shown in FIG. 1B, the spacer insulating layer 17 is proceeded with an etchback process so that a spacer 18 contacting to lateral sides of the gate electrode is formed. At this time, the gate oxide layer 12 exposed on a surface of the substrate 11 during the formation of the spacer 18 is simultaneously etched as well.

Subsequently, high concentrations of impurities are ion implanted by using the gate electrode and the spacer 18 as a mask so to form a highly concentrated impurity area 19 connected electrically to the lowly concentrated impurity area 16. Generally, the highly concentrated impurity area is called as source/drain area.

In the prior art as described above, the re-oxidation process is operated at a temperature greater than about 800° C. by proceeding a thermal oxidation process. Hence, the polysilicon layer 13 is selectively oxidized to prevent lateral sides of the tungsten layer 14 from being oxidated.

If the tungsten layer 14 is oxidated, a shape of the gate electrode is deteriorated, and thus, an effective line width of the tungsten layer 14 becomes significantly narrowed. As a result of this narrowed line width, it is difficult to obtain conductivity of the gate electrode.

However, the tungsten layer 14, in accordance with the prior art, is easily oxidated at a temperature above about 400° C. An oxide provided through a low pressure chemical vapor deposition (hereinafter referred as to LPCVD) technique cannot be used for the spacer insulating layer 17 because a conditional temperature for the LPCVD technique is approximately 600° C.

For instance, in case of a high temperature oxide (HTO) layer provided through the LPCVD, a temperature for the deposition is greater than about 750° C. and $N_2O$ gas employed during the deposition is used to oxidate the tungsten layer 14.

Also, in case of a low pressure tetra ethyl ortho silicate (LPTEOS) provided through the LPCVD technique, a layer is deposited through a heat decomposition of the TEOS at a temperature higher than about 600° C. However, oxygen released by the heat decomposition of the TEOS oxidates the tungsten layer 14.

Therefore, when fabricating a semiconductor device that employs a metal such as tungsten as a gate electrode, a nitride layer provided through the LPCVD technique is used as a spacer so that the metal included in the gate electrode is suppressed from the oxidation.

However, in case of depositing the nitride immediately after the etching process for forming the gate electrode, there are disadvantages in that a lifetime of a hot carrier is decreased due to a stress concentrated at bottom corners of the gate electrode and characteristics of a device, e.g., gate induced drain leakage and refresh are degraded.

Consequently, it is recently attempted to adapt plasma enhanced tetra ethyl ortho silicate (PETEOS) as a spacer wherein a low thermal deposition is possible. However, the PETEOS is limited to be used for the spacer due to a lowered density of the PETEOS.

SUMMARY OF THE INVENTION

It is, therefore, an object of the present invention to provide a method for fabricating a semiconductor device capable of preventing an oxidation of a metal included in a gate electrode and suppressing a stress concentrated at bottom corners of the gate electrode. It is another object of the present invention to provide a semiconductor device improved on a quality of a gate oxide layer.

In accordance with an aspect of the present invention, there is provided a method for fabricating a semiconductor device, comprising the steps of: forming a gate oxide layer on a substrate; forming a gate electrode including at least one metal layer on the gate oxide layer; forming an oxide layer on the substrate including the gate electrode at a temperature lower than oxidation temperature of the metal layer; and etching selectively the densified oxide layer so as to form an oxide spacer on the lateral sides of the gate electrode.

In accordance with another aspect of the present invention, there is also provided a method for fabricating a semiconductor device, comprising the steps of: forming a gate oxide layer on a substrate; forming a gate electrode by stacking a silicon based conductive layer and a metal layer on the gate oxide layer; forming an oxide layer on the substrate including the gate electrode at a temperature lower than oxidation temperature of the metal layer; forming an oxide spacer on lateral sides of the gate electrode through an etching back process to the oxide layer; and oxidating selectively lateral sides of the silicon based conductive layer, contacting to the oxide spacer, through a thermal process.

BRIEF DESCRIPTION OF THE DRAWING(S)

The above and other objects and features of the present invention will become apparent from the following description of the preferred embodiments given in conjunction with the accompanying drawings, in which.

DETAILED DESCRIPTION OF THE INVENTION

Other objects and aspects of the invention will become apparent from the following description of the embodiments with reference to the accompanying drawings, which is set forth hereinafter.

FIGS. 2A to 2D are cross-sectional views showing a method for fabricating a semiconductor device in accordance with a first preferred embodiment of the present invention.

Figure 1A:
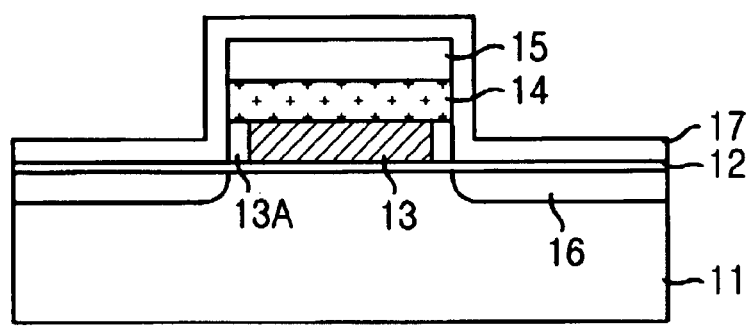
FIGS. 1A and 1B are cross-sectional views illustrating a method for fabricating a semiconductor device in accordance with a prior art.
Figure 1B:
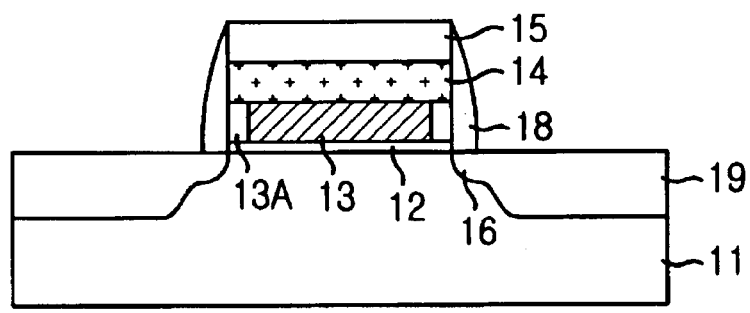
Figure 2A:
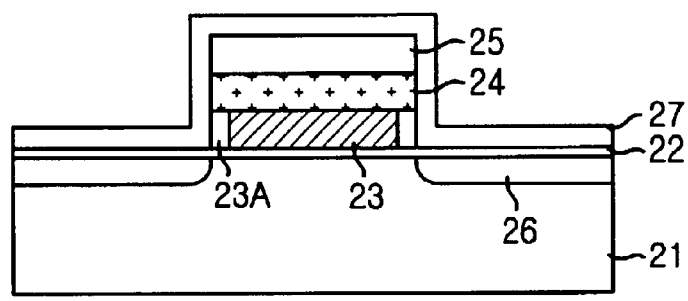
FIGS. 2A to 2D are cross-sectional views showing a method for fabricating a semiconductor device in accordance with a first preferred embodiment of the present invention.

Referring to FIG. 2A, a gate oxide layer 22 is formed on a substrate 21, and a polysilicon layer 23, a tungsten layer 24 and a hard mask 25 are sequentially deposited thereon. Herein, a nitride is used for the hard mask 25.

Next, a photo film mask (not shown) for forming a gate electrode is formed on the hard mask 25. The hard mask 25 is then firstly etched through the use of the photo film mask, which is, in turn, removed. In subsequent to the removal of the photo film mask, the etched hard mask 25 etches the tungsten layer 24 and the polysilicon layer 23 so as to form a gate electrode as stacked in an order of the polysilicon layer 23 and the tungsten layer 24.

Next, in the etching process for forming the gate electrode, damages provoked at a surface of the gate oxide layer 22 and remnants from the etching process are removed. In order to recover a confidence level of the gate oxide layer 22, a re-oxidation process for selectively re-oxidating solely the polysilicon layer 23 is proceeded so that an oxide layer 23A is formed on lateral sides of the polysilicon layer 23. At this time, the re-oxidation process particularly uses a specific process, e.g., a thermal oxidation process carried out a temperature above 800° C.

Performing the above re-oxidation process prevents electric fields from being concentrated at bottom corners of the gate electrode.

Next, low concentrations of impurities are ion implanted by using the gate electrode as an ion implantation mask and forms a lowly concentrated impurity area 26 on the substrate 21. Typically, in case of n-metal oxide semiconductor field effect transistor (nMOSFET), this lowly concentrated impurity area 26 is called as a lightly doped drain (LDD) area. Then, tetra ethyl ortho silicate 27 (hereinafter referred as to plasma enhanced tetra ethyl ortho silicate being abbreviated as PETEOS) is deposited on an entire structure including the gate electrode through a plasma enhanced chemical vapor deposition (hereinafter referred as to PECVD) technique. Herein, the PETEOS 27 is used for an insulating layer that is to be utilized for a spacer (hereinafter referred as to spacer insulating layer).

At this time, the PETEOS 27 is an oxide deposited through a heat decomposition of the TEOS, which is a source gas, with use of plasma energy. Particularly, the PETEOS 27 is applicable for a low temperature deposition carried out temperature lower than about 400° C. Accordingly, the tungsten layer 24 applied as the gate electrode is not oxidated during the PETEOS 27 deposition.

Meanwhile, although the PETEOS 27 is reported to release oxygen during the heat decomposition for the deposition, the oxidation of the tungsten layer 24 via the oxygen does not occur since the deposition temperature is significantly low.

The following describes conditions for depositing the PETEOS 27 in detail. The TEOS and any one selected from either $O_2$ or $O_3$ are used as a source gas. A pressure for the deposition ranges from about 1.0 Torr to about 5.0 Torr; however, it is preferable to apply about 3.0 Torr of the pressure for the PETEOS deposition. Also, although it is possible to deposit the PETEOS 27 to a thickness in a range from about 50 Å to about 500 Å, a thickness to be used for a spacer preferably ranges from about 200 Å to about 300 Å. Furthermore, a temperature for the deposition can be possibly in a range from about 300° C. to about 600° C.; however, it is preferable to set a temperature in about 400° C., at which layer characteristics and the oxidation of the tungsten layer 24 can be optimally controlled.

Figure 2B:
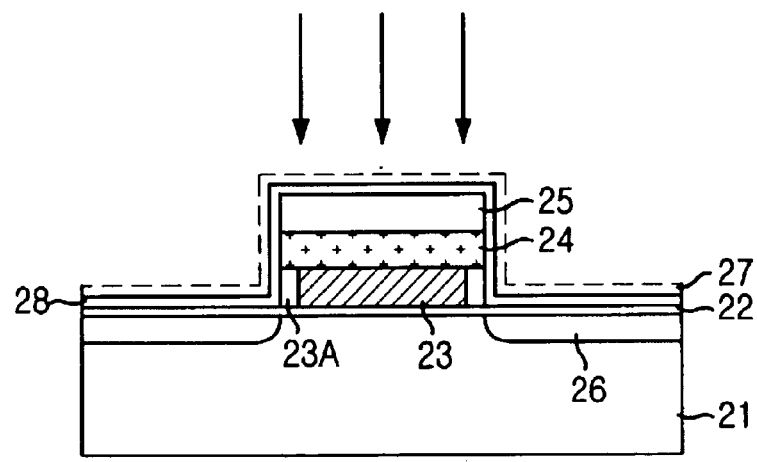

With reference to FIG. 2B, an ambient gas, which does not include oxygen, is used for densifying a texture of the PETEOS 27. For instance, a thermal process is proceeded at a temperature ranging from about 700° C. to about 1000° C. in an ambient of either inert gas, e.g., nitrogen N or argon Ar or reducing gas, e.g., hydrogen $H_2$ or ammonia $NH_3$.

Performing a high temperature process as described above enables the PETEOS 27 to obtain a density that can be used for an insulating layer by changing an initial low density of the PETEOS 27 hardly applicable for the deposition into a density higher than the initial density. As illustrated in FIG. 2B, the PETEOS 27 initially deposited also becomes hardened after the high thermal process, and thus, the density of the PETEOS 27 increases although its thickness becomes thinner.

Hence, an etching amount, i.e., a etching ratio of a highly densified PETEOS 28 can be controlled during an etchback of the nitride for forming a subsequent spacer by controlling a temperature and a duration time of the high temperature process.

Meanwhile, there might exist a potential of an oxidation of the tungsten layer 24 during the high temperature process to the initial PETEOS 27. However, the oxidation of the tungsten layer 24 does not occur since an ambient of the inert gas or the reducing gas is applied to the high temperature process, and the hardening of the PETEOS 27 further blocks a penetration of the ambient gas. In case that there occurs the oxidation of the tungsten layer 24, the oxidation is not caused by the PETEOS 27 but highly caused by the ambient gas for the high temperature process. Therefore, it is preferable to control the high temperature process appropriately.

Figure 2C:
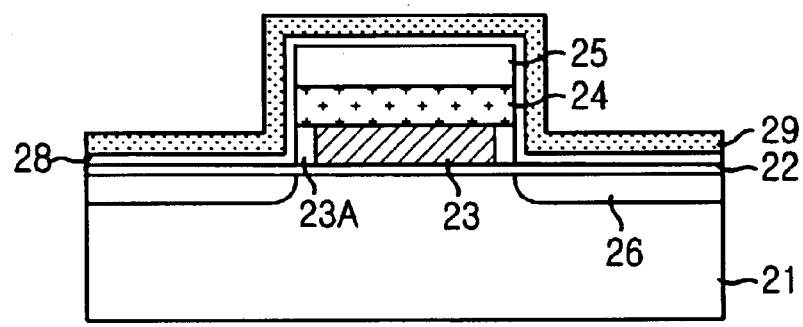

With reference to FIG. 2C, a nitride 29 is deposited on the highly densified PETEOS 28 through a low pressure chemical vapor deposition (hereinafter referred as to LPCVD) technique. At this time, the highly densified PETEOS 28 enacts as a buffering layer for preventing an electric field from being stressed at bottom corners of the gate electrode and a surface of the substrate 21 while depositing the nitride 29.

In addition, the nitride 29 is deposited to a thickness ranging from about 100 Å to about 300 Å at a temperature ranging from about 650° C. to about 750° C. by taking accounts of a distance between the gate electrodes or word lines and a thickness of the highly densified PETEOS 28.

Figure 2D:
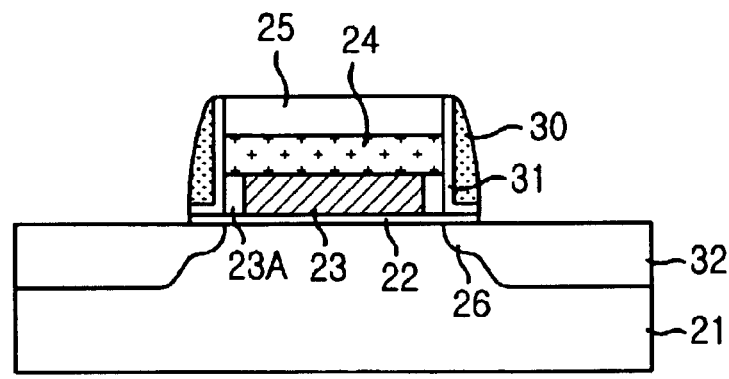

Referring to FIG. 2D, an etchback process is applied to the nitride 29 as to form a nitride spacer 30 contacting to lateral sides of the gate electrode. At this time, the densified PETEOS 28 is also simultaneously etched during the etchback process for forming the nitride spacer 30, thereby forming a PETEOS-spacer 31 with the highly densified PETEOS 28. This means that there formed a double spacer including the PETEOS-spacer 31 contacting to the gate electrode and the nitride spacer 30 successively encompassing the PETEOS-spacer 31.

As a subsequent process, high concentrations of impurities are ion implanted by using the gate electrode and the double spacer as an ion implantation mask so as to form a highly concentrated impurity area, i.e., a source/drain area 32 being electrically connected to the lowly concentrated impurity area 26.

The following Table 1 shows comparisons among a loss of a low pressure tetra ethyl ortho silicate (hereinafter referred as LPTEOS) with a thermal process in a buffered oxide etchant (BOE), a high temperature oxide layer and a LPTEOS without a high temperature process. Especially, the LPTEOS is provided through a LPCVD technique by being proceeded with the thermal process for about 30 minutes in an atmosphere of nitrogen at a temperature maintained approximately in 850° C. As seen from the Table 1, characteristics of a thin film are improved due to the thermal process.

TABLE 1

|  | High temperature oxide layer | LPTEOS without thermal process | LPTEOS with thermal process |
| --- | --- | --- | --- |
| Before wet dip | 450 Å | 510 Å | 496 Å |
| After wet dip | 429 Å | 473 Å | 475 Å |
| Difference | 21 Å | 37 Å | 21 Å |

Even in case of the PETEOS, it is still possible to improve the thin film characteristics by controlling a temperature and a duration time for the thermal process.

FIGS. 3A to 3E are cross-sectional views illustrating a method for fabricating a semiconductor device in accordance with a second preferred embodiment of the present invention.

Figure 3A:
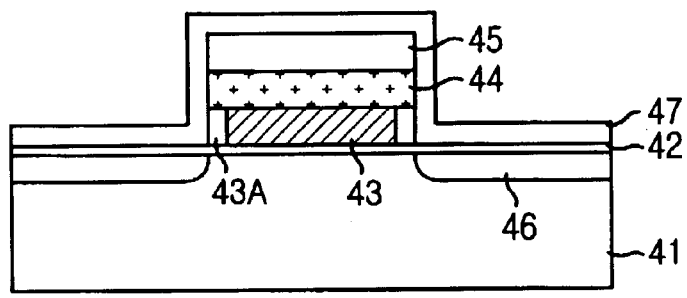
FIGS. 3A to 3E are cross-sectional views depicting a method for fabricating a semiconductor device in accordance with a second preferred embodiment of the present invention.

With reference to FIG. 3A, a gate oxide layer 42 is formed on a substrate 41, and a polysilicon layer 43, a tungsten layer 44 and a hard mask 45 are sequentially deposited thereon. Herein, a nitride is used for the hard mask 45.

Next, a mask (not shown) for forming a gate electrode is formed on the hard mask 45, which is, in turn, firstly etched and removed thereafter. Then, the etched hard mask 45 etches the tungsten layer 44 and the polysilicon layer 43 so as to form a gate electrode stacked in a sequential order of the polysilicon layer 43 and the tungsten layer 44.

After the formation of the gate electrode, a lowly densified PETEOS 47 (hereinafter referred as to PETEOS) is deposited as an insulating layer to be used for a spacer (hereinafter referred as to spacer insulating layer) on an entire surface including the gate electrode.

At this time, the PETEOS 47 is an oxide deposited through a heat decomposition of TEOS, which is a source gas, with use of plasma energy. It is known that the deposition is possible at a temperature lower than about 400° C. Therefore, the tungsten layer 44 applied for the gate electrode is not oxidated when depositing the PETEOS 47.

The following explains conditions for the PETEOS 47 deposition. The TEOS and any one selected from either $O_2$ or $O_3$ are used as a source gas. It is possible for a pressure for the deposition to be in a range from about 1.0 Torr to about 5.0 Torr; however, it is preferable to have the pressure in approximately 3.0 Torr. A thickness of the spacer is preferably in a range from about 200 Å to about 300 Å although it is still possible to set the thickness to be in a range from about 50 Å to about 500 Å. Moreover, a temperature for the deposition possibly ranges from about 300° C. to about 600° C.; however, a temperature is preferably maintained in about 400° C., at which is an optimum to control the oxidation of the tungsten layer 44 and characteristics of the deposited layer.

Figure 3B:
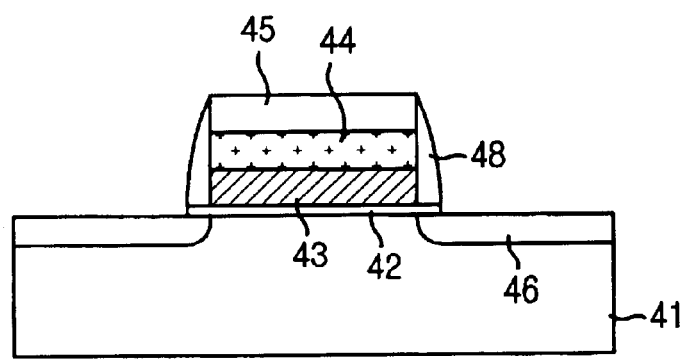

Referring to FIG. 3B, an etchback process is proceeded to the PETEOS 47 to form a PETEOS-spacer 48 contacting to lateral sides of the gate electrode. At this time, the exposed gate oxide layer 42 is also simultaneously etched during the etching of the PETEOS 47.

Figure 3C:
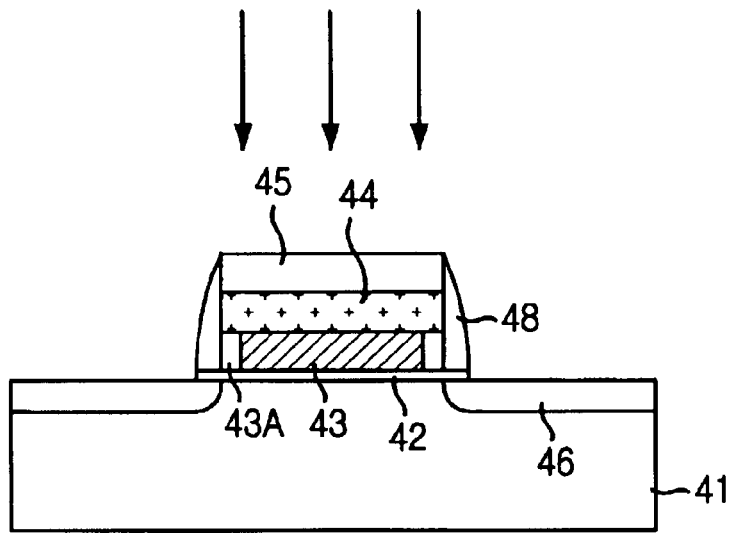

With reference to FIG. 3C, when proceeding the etching process for forming the gate electrode, damages provoked at a surface of the gate oxide layer 42 and remnants from the etching process are removed, and only the polysilicon layer 43 is selectively re-oxidated to recover a confidence level of the gate oxide layer 42. Through the re-oxidation process, there formed an oxide layer 43A on lateral sides of the polysilicon layer 43.

The re-oxidation process uses $H_2O$ as an oxidation agent in an atmosphere of $H_2$. However, the ambient gas $H_2$ and the oxidation agent $H_2O$ easily penetrate into the PETEOS-spacer 48, and this factor causes only the polysilicon layer 43 to be selectively etched and the $H_2$ gas to provide and maintain an environment for reduction so as to suppress the oxidation of the tungsten layer 44.

Also, the re-oxidation process is carried out at a temperature ranging from about 700° C. to about 900° C. A texture of the PETEOS-spacer 48 can be densified in more extents through the re-oxidation process carried out at the above-mentioned high temperature. That is, the layer texture of the TEOS provided from a plasma deposition technique becomes densified in case of performing the thermal process at a temperature greater than about 750° C., while performing the thermal process above about 800° C. elicits the layer texture to be similar to a high temperature oxide (HTO) layer provided from a LPCVD.

As described the above, the PETEOS-spacer 48 has consequently improved properties as an insulating layer through the re-oxidation process.

Figure 3D:
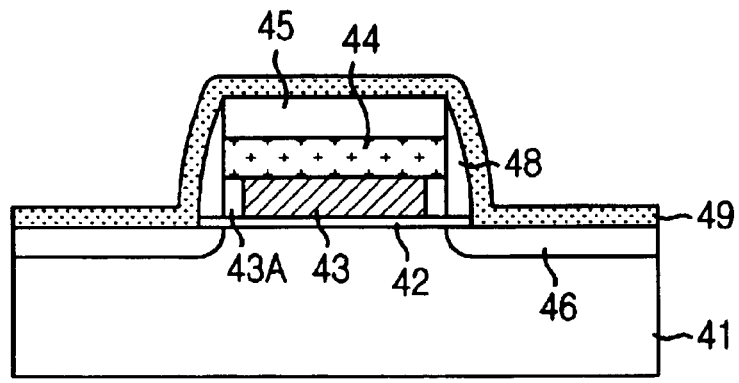

Referring to FIG. 3D, a nitride 49 is deposited on an entire structure obtained after the re-oxidation process by applying the LPCVD technique. At this time, the PETEOS-spacer 48 also enacts as a buffering layer for preventing stresses from being concentrated at bottom corners of the gate electrode and a surface of the substrate 41 when depositing the nitride 49.

Meanwhile, the nitride 49 is deposited at a temperature ranging from about 650° C. to about 750° C. until having a thickness preferably in a range from about 100 Å to about 300 Å by taking accounts of a distance between the gate electrodes or word lines and a thickness of the PETEOS-spacer 48.

Figure 3E:
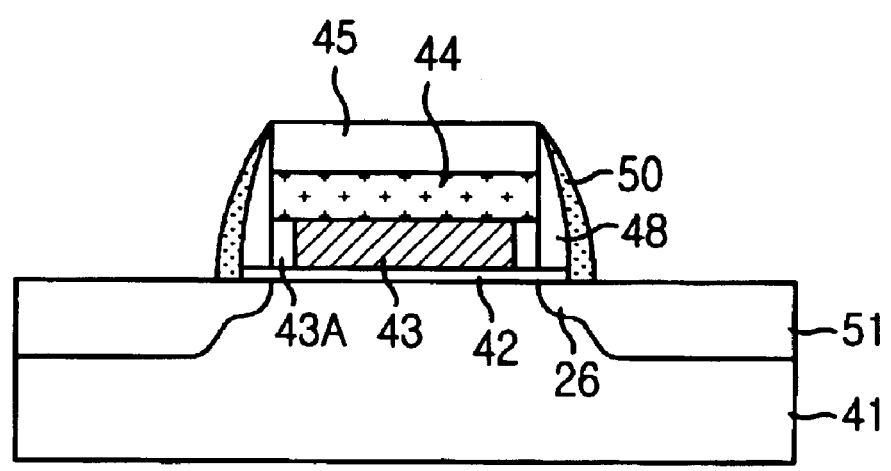

As illustrated in FIG. 3E, there formed a nitride spacer 50 encompassing the PETEOS-spacer 48 that is contacted to the lateral sides of the gate electrode through the etchback process to the nitride 49. Consequently, a double spacer structure including the PETEOS-spacer 48 and the nitride spacer 49 is established.

As a subsequent process to the formation of the double structure, high concentrations of impurities are ion implanted by using the gate electrode and the double spacer as ion implantation masks so as to form a highly concentrated impurity area, i.e., source/drain area 51 being electrically connected to a lowly concentrated impurity area.

In accordance with the present invention, it is possible to prevent the oxidation of the metal layer, e.g., the tungsten layer included in the gate electrode through the use of the PETEOS, wherein it is provided through the plasma chemical deposition technique and enacts as a spacer of the gate electrode including the metal. Also, there provided advantages in that the formation of the PETEOS prior to a nitride deposition results in a reduction of stresses provoked from the nitride deposition, which in turn, increases a lifetime of a hot carrier, a decrease of a generalized interference detection and localization (GIDL) and an improvement on a refresh characteristic.

While the present invention has been described with respect to certain preferred embodiments, it will be apparent to those skilled in the art that various changes and modifications may be made without departing from the scope of the invention as defined in the following claims.

What is claimed is:

1. A method for fabricating a semiconductor device, comprising the steps of:

forming a gate oxide layer on a substrate;

forming a gate electrode including at least one metal layer on the gate oxide layer; forming a PETEOS oxide layer on the substrate including the gate electrode at a temperature lower than oxidation temperature of the metal layer;

densifying the PETEOS oxide layer by performing a thermal process after forming the PETEOS oxide layer; and etching selectively the densified PETEOS oxide layer so as to form an oxide spacer on the lateral sides of the gate electrode.

2. The method as recited in claim 1, wherein the step of forming the PETEOS oxide layer used for an oxide spacer proceeds with a plasma enhanced chemical deposition technique using a source gas including tetra ethyl ortho silicate (TEOS).

3. The method as recited in claim 1, wherein the PETEOS oxide layer is formed at a temperature ranging from about 300° C. to about 600° C.

4. The method as recited in claim 2, wherein the source gas further includes $O_2$ or $O_3$.

5. The method as recited in claim 1, wherein the densified PETEOS oxide layer is formed to a thickness in a range from about 50 Å to about 500 Å.

6. The method as recited in claim 1, wherein the step of densifying the PETEOS oxide layer is carried cut at a pressure ranging from about 1.0 Torr to about 5.0 Torr.

7. The method as recited in claim 1, wherein the thermal process is performed at a temperature ranging from about 700° C. to about 1000° C. in an atmosphere of either inert gas or reducing gas.

8. The method as recited in claim 1, wherein the step of forming the gate electrode includes further the steps of:

forming sequentially a polysilicon layer and a metal layer on the gate oxide layer;

etching selectively the metal layer and the polysilicon layer; and oxidizing selectively lateral sides of the polysilicon layer.

9. The method as recited in claim 2, wherein the step of forming the oxide spacer further includes the steps of:

forming a nitride on the densified oxide layer; and forming a nitride spacer through an etchback process to the nitride as simultaneously as forming the oxide spacer on the lateral sides of the gate electrode.

10. A method for fabricating a semiconductor device, comprising the steps of:

forming a gate oxide layer on a substrate;

forming a gate electrode by stacking a silicon based conductive layer and metal layer on the gate oxide layer;

forming a PETEOS oxide layer on the substrate including the gate electrode at a temperature lower than oxidation temperature of the metal layer;

forming an oxide spacer on lateral sides of the gate electrode through an etching back process to the PETEOS oxide layer; and oxidizing selectively lateral sides of the silicon based conductive layer, contacting to the oxide spacer, through a thermal process.

11. The method as recited in claim 10, wherein the step of oxidizing selectively the lateral sides of the silicon based conductive layer is proceeded at a temperature in a range from about 700° C. to about 900° C. in an atmosphere of $H_2$ with use of $H_2O$ as an oxidation agent.

12. The method as recited in claim 10, wherein the step of oxidizing selectively the lateral sides of the silicon based conductive layer includes the steps of:

depositing a nitride on the substrate including the oxide spacer through a low pressure chemical deposition technique; and forming a nitride spacer on the oxide spacer through an etchback process to the nitride.

13. The method as recited in claim 10, wherein the PETEOS oxide layer is formed at a temperature ranging from about 300° C. to about 600° C.

14. The method as recited in claim 10, wherein the step of forming the PETEOS oxide layer proceeds with a plasma enhanced chemical deposition techniques using a source gas including TEOS.

15. The method as recited in claim 10, further comprising the step of densifying the PETEOS oxide layer through a thermal process after forming the PETEOS oxide layer.

* * * * *